United States Patent
Aziz et al.

(10) Patent No.: US 9,397,674 B2
(45) Date of Patent: Jul. 19, 2016

(54) CLOCK RECOVERY USING QUANTIZED PHASE ERROR SAMPLES USING JITTER FREQUENCY-DEPENDENT QUANTIZATION THRESHOLDS AND LOOP GAINS

(71) Applicant: LSI Corporation, San Jose, CA (US)

(72) Inventors: Pervez M. Aziz, Dallas, TX (US); Shiva Prasad Kotagiri, Campbell, CA (US); Sundeep Venkatraman, San Jose, CA (US); Sunil Srinivasa, Santa Clara, CA (US); Amaresh V. Malipatil, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 92 days.

(21) Appl. No.: 14/145,493

(22) Filed: Dec. 31, 2013

(65) Prior Publication Data

US 2015/0188551 A1    Jul. 2, 2015

(51) Int. Cl.
*H03D 3/24* (2006.01)
*H03L 7/087* (2006.01)
*H03L 7/06* (2006.01)

(52) U.S. Cl.
CPC . *H03L 7/087* (2013.01); *H03L 7/06* (2013.01)

(58) Field of Classification Search
CPC ... H03D 13/003; H03D 7/081; H03D 7/0812; H03D 7/087; H03D 7/093; H03D 7/033
USPC ......................................... 375/375, 376, 377
See application file for complete search history.

(56) References Cited

U.S. PATENT DOCUMENTS

| | | |
|---|---|---|
| 6,940,926 B1 | 9/2005 | Yang et al. |
| 7,421,050 B2 | 9/2008 | Aziz et al. |
| 7,599,461 B2 | 10/2009 | Aziz et al. |
| 7,616,686 B2 | 11/2009 | Aziz et al. |
| 7,916,822 B2 | 3/2011 | Aziz et al. |
| 8,508,213 B2 | 8/2013 | Todorokihara |
| 8,779,812 B1 * | 7/2014 | Kavanagh et al. ............ 327/150 |
| 2005/0129134 A1 * | 6/2005 | Itri ............................... 375/259 |
| 2006/0239661 A1 | 10/2006 | Yang et al. |
| 2008/0165042 A1 * | 7/2008 | Hochschild ................... 341/143 |
| 2015/0103961 A1 * | 4/2015 | Malipatil et al. .............. 375/355 |

OTHER PUBLICATIONS

Jeon et al.; A Bang-Bang Clock and Data Recovery Using Mixed Mode Adaptive Loop Gain Strategy; IEEE Journal of Solid-State Circuits, vol. 48, No. 6, Jun. 2013.

* cited by examiner

*Primary Examiner* — Helene Tayong

(57) ABSTRACT

A clock and data recovery device includes a phase detector, a quantizer, and a loop filter. The phase detector produces a phase error samples at an output representing a phase difference between a phase-adjusted clock and an input data signal. The quantizer, coupled to the output of the phase detector and responsive to high threshold and low threshold values, produces a tri-valued quantized phase error samples at an output. The loop filter filters either the quantized phase error samples or the phase error samples to control the phase-controlled clock. A frequency detector, determining the frequency of jitter present in the input data signal, addresses a look-up table to provide the jitter-frequency dependent high and low threshold values and to control which phase error samples is processed by the loop filter. The frequency detector determines the jitter frequency by taking the ratio of peak values of low pass-filtered phase error samples.

21 Claims, 6 Drawing Sheets

FIG. 2

| BAND ESTIMATE | PROPORTIONAL PATH GAIN Pg | INTEGRAL PATH GAIN Ig | PROPORTIONAL UPPER THRESHOLD THRPU | PROPORTIONAL LOWER THRESHOLD THRPL | INTEGRAL UPPER THRESHOLD THRIU | INTEGRAL LOWER THRESHOLD THRIL | FLSEL |
|---|---|---|---|---|---|---|---|
| LOW | $Pg_L$ | $Ig_L$ | THRPULF | THRPLLF | THRIULF | THRILLF | USR_DEF_L |
| HIGH | $Pg_H$ | $Ig_H$ | THRPUHF | THRPLHF | THRIUHF | THRILHF | USR_DEF_H |

124

404

US 9,397,674 B2

CLOCK RECOVERY USING QUANTIZED PHASE ERROR SAMPLES USING JITTER FREQUENCY-DEPENDENT QUANTIZATION THRESHOLDS AND LOOP GAINS

FIELD OF THE INVENTION

The present invention relates to receivers generally and, more specifically, to clock and data recovery circuitry therein.

BACKGROUND

Communication receivers that recover digital signals must sample an analog waveform and then reliably detect the sampled data. Signals arriving at a receiver are typically corrupted by intersymbol interference (ISI), crosstalk, echo, and other noise. As data rates increase, the receiver must both equalize the channel, to compensate for such corruptions, and detect the encoded signals at increasingly higher clock rates. Decision-feedback equalization (DFE) is a widely used technique for removing intersymbol interference and other noise at high data rates.

Generally, decision-feedback equalization utilizes a nonlinear equalizer to equalize the channel using, a feedback loop based on previously recovered (or decided) data. In one typical DFE-based receiver implementation, a received analog signal is sampled in response to a data-sampling clock after DFE correction and compared to one or more thresholds to generate the recovered data.

To acquire the correct clock phase and properly sample incoming data signals in the center of the data "eye" opening, a clock and data recovery (CDR) circuit derives the correct clock phase by "locking" onto the eye center or transitions in the incoming data signals. To compensate for jitter in the incoming data signals, the CDR might be implemented as a second-order CDR having a proportional term and an integral term in the transfer function of the CDR. To tailor the transfer function to meet certain requirements (e.g., jitter response) of the application using the CDR, analog CDR implementations rely on the adjustment of component values such as resistances, currents, capacitances, etc. to meet the desired requirements. However, the value of the components are dependent on temperature and operating voltage, and manufacturing process variations might make CDRs made under certain process "corners" incapable of operating with the desired requirements. Digital CDR solutions solve analog shortcomings but meeting jitter requirements can be a challenge at high data rates.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed, subject matter.

In one embodiment of the invention, a clock and data recovery device comprises a phase detector, a quantizer, and a loop filter. The phase detector is coupled to an input node for producing phase error samples at an output. The quantizer, coupled to the output of the phase detector and responsive to a high threshold value and a low threshold value different from the high threshold value, produces a tri-valued quantized phase error samples at an output. The loop filter is coupled to the output of the quantizer.

BRIEF DESCRIPTION OF THE DRAWINGS

Other embodiments of the present invention will become more fully apparent from the following detailed description, the appended claims, and the accompanying drawings in which like reference numerals identify similar or identical elements.

FIG. 2 is an exemplary look-up table having entries of various CDR gains and quantizer thresholds based on the sinusoidal jitter frequency band determined by the sinusoidal jitter frequency band detector of FIGS. 1, 3, and 4;

DETAILED DESCRIPTION

Figure 1:
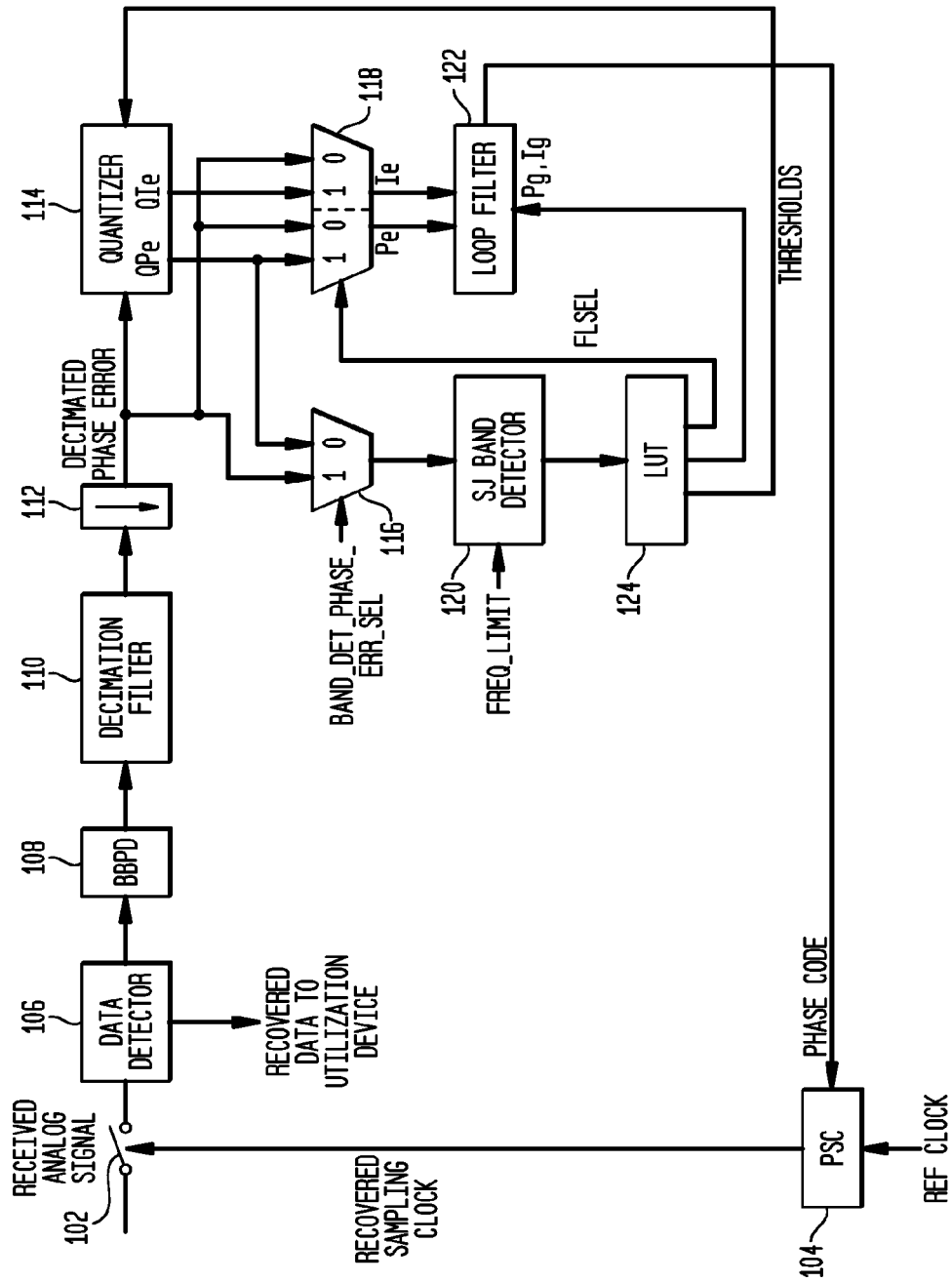
FIG. 1 is a simplified block diagram of a clock and data recovery circuit usable in a serializer/deserializer (SERDES) communication system incorporating a sinusoidal jitter band detector and a phase error quantizer according to one embodiment of the invention.

In addition to the patents referred to herein, each of the following patents and patent applications are incorporated herein in their entirety:

U.S. Pat. No. 7,616,686, titled "Method and Apparatus for Generating One or More Clock Signals for a Decision-Feedback Equalizer Using DFE Detected Data", by Aziz et al.

U.S. Pat. No. 7,599,461, titled "Method and Apparatus for Generating One or More Clock Signals for a Decision-Feedback Equalizer Using DFE Detected Data in the Presence of an Adverse Pattern", by Aziz et al.

U.S. Pat. No. 7,421,050, titled "Parallel Sampled Multi-Stage Decimated Digital Loop Filter for Clock/Data Recovery", by Aziz et al.

U.S. Pat. No. 7,916,822, titled "Method and Apparatus for Reducing Latency in a Clock and Data Recovery (CDR) Circuit", by Aziz et al.

U.S. patent application Ser. No. 14/053,069, titled "Digital Frequency Band Detector For Clock and Data Recovery" by Malipatil et al.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

Also for purposes of this description, the terms "couple", "coupling", "coupled", "connect", "connecting", or "connected" refer to any manner known in the art or later developed in which energy is allowed to transfer between two or more elements, and the interposition of one or more additional elements is contemplated, although not required. Conversely, the terms "directly coupled", "directly connected", etc., imply the absence of such additional elements. Signals and corresponding nodes or ports might be referred to by the same name and are interchangeable for purposes here. The term "or" should be interpreted as inclusive unless stated otherwise.

The present invention will be described herein in the context of illustrative embodiments of a clock and data recovery device, using a sinusoidal jitter frequency band detection circuit and a phase error quantizer, adapted for use in a digital data receiver or the like. It is to be appreciated, however, that the invention is not limited to the specific apparatus and methods illustratively shown and described herein.

As data rates increase for serializer/deserializer (SERDES) applications, the channel quality degrades. Decision feedback equalization (DFE) in conjunction with an optional finite impulse response (FIR) filter in a transmitter (TX) and an analog equalizer within the receiver is generally used to achieve the bit error rate (BER) performance needed for reliable communications. A clock and data recovery (CDR) circuit or device is provided to extract clock signals for properly sampling received signals to extract data for further processing in conjunction with the DFE.

FIG. 1 is a block diagram of a second-order CDR 100 in accordance with one embodiment of the invention with loop filter having a proportional and integral paths. Operation of the CDR 100 can be understood generally from the above-identified U.S. Pat. No. 7,421,050. Briefly as described herein, a received analog signal is sampled by sampler 102 in response to a recovered sampling clock signal from a phase-shift controller (PSC) 104. The phase of the analog waveform applied to sampler 102 is typically unknown and there may be a phase/frequency offset between the frequency at which the original data was transmitted and the nominal receiver sampling clock frequency. The function of the PSC 104 is to generate a phase-adjusted sample clock that allows sampler 102 to properly sample the analog waveform such that when the sampled waveform is passed through a slicer, the data is recovered property despite the fact that the phase and frequency of the transmitted signal is not known. For purposes here, the PSC selects or generates a clock phase from a reference clock (REFCLK) in response to a phase code and, as will be described in more detail below, the rest of the CDR 100 adaptively adjusts the phase of a nominal reference clock signal to produce the recovered sampling clock that the sampler 102 uses to sample the analog waveform to allow proper data detection.

The analog signal applied to sampler 102 might come from a transmission medium (transmission line, backplane traces, etc.) with our without analog equalization.

A data decoder 106, which might include the aforementioned DFE (not shown), processes the samples from sampler 102 to recover data to use by a utilization device such as a computer. The data detector 106 also provides transition samples (typically samples in quadrature to the samples used to provide the recovered data) that are sent to a bang-bang phase detector (BBPD) 108. The transition sample generation is facilitated by a second transition clock (not shown) from the PSC 104 to the data detector. Bang-bang phase detectors are well known and other phase detectors other than a BBPD might be used and might be implemented using look-up tables. For a general discussion of bang-bang phase detectors, see, for example, J. D. H. Alexander, "Clock Recovery from Random Binary Signals," Electronics Letters, 541-42 (October, 1975), incorporated by reference herein in its entirety. In one embodiment and as is known in the art, the data detectors 106 and BBPD 108 can represent an array of parallel data detectors and phase detectors and a conventional decimation filter 110 that adds or performs a "majority vote" function to combine the phase error sample outputs of the parallel phase detectors. The filtered phase error samples from the filter 110 is optionally decimated by down-sampler 112 to reduce the rate of phase error signals or samples for processing by later circuitry, thus reducing power consumption by the CDR 100 and reducing the speed requirements for some of the logic therein. Exemplary decimation rates of 2:1 (one output sample for every two received) or greater might be used.

Decimated phase error samples from down-sampler 112 are applied to a quantizer 114 and to multiplexers 116, 118. As will be discussed in more detail below, the quantizer 114 receives the decimated phase error samples and compares them to two thresholds to generate two tri-valued (+1, 0, and −1 in this exemplary embodiment) quantized phase error sample streams, QPe and QIe. Each multiplexer 116, 118, under control of their respective control signal, selects either the decimated phase error samples or the quantized phase error samples to drive sinusoidal jitter (SJ) frequency detector 120 and loop filter 122, respectively. The frequency detector 120 is described in more detail below in connection with FIGS. 3 and 4, but it is sufficient for purposes here to know that the detector 120 detects whether low frequency jitter is present in the received analog signal by comparing the frequency components of the phase error (either the quantized version QPe from quantizer 114 or the decimated phase error samples from down-sampler 112, as selected by a user configuring the BAND_DET_PHASE_ERR_SELECT control signal as desired) to a user-supplied frequency limit value on input FREQ_LIMIT. The output of the SJ band detector 120 controls a look-up table that, depending on the detected jitter frequency band, supplies threshold values to the quantizer 114, provides gain values to the loop filter 122, and controls the multiplexer 118. Details concerning the LUT 124 are discussed below in connection with FIG. 2.

The loop filter 122 is essentially the same as that disclosed in the above-mentioned patent application Ser. No. 14/053, 069 and a complete detailed description of the filter 122 is provided there. For purposes here, it is sufficient to describe the loop filter 122 as a second order filter having a proportional path and an integral path therein. The proportional path and the integral path might have different gains. Pg, Ig, respectively, that are supplied by the look-up table 124. The gain values are chosen to be dependent on the jitter frequency band detector 120 determining whether or not low frequency jitter is present in the decimated phase error samples or the quantized phase error samples as selected by the user. The output of the loop filter is the phase code value used to control the recovered sampling clock phase from PSC 104, as described above.

By using an all-digital CDR, compact, low power stable designs are possible with programmable functionality that can be tailored to the desired application to meet the relevant standard such as the aforementioned sinusoidal jitter requirements. It is understood that CDR designs having only one path, e.g., just a proportional path, or more than two paths can also be implemented to take advantage of the techniques described here.

To allow for an all-digital design that can handle sinusoidal jitter, a digital SJ frequency band detector 120 responsive to the output of the phase error data from multiplexer 116, determines the frequency of any SJ in the received analog signal. Depending on which frequency band the SJ is determined to be in, a look-up table (LUT) 124 addressed by the frequency band data from detector 120 provides various operational values and control signals to the CDR 100. An example of the LUT 124 is shown in FIG. 2 for two different jitter frequency bands, here bands LOW and HIGH. In alternative embodiments, three bands or more might be used. The LUT 124 stores the proportional path gain value Pg and the integral path gain value Ig supplied, to the loop filter 122. In addition, the LUT 124 provides threshold values THRPU, THRPL, THRIU, and THRIL to the quantizer 114 as will be explained in more detail below. The control signal FLSEL controls the multiplexer 118 to select either the decimated phase error samples or the quantized phase error samples to couple to the loop filter 122. In this embodiment, the LUT is programmable by the user but one or more of the values therein could be predetermined based on modeling the CDR under various jitter and signal conditions in view of the possible applications of the CDR 100 to achieve the desired performance requirements for the CDR 100. For the embodiment shown here, the control signal FLSEL: is user defined (USR_DEF_L), e.g., a "1", when low frequency jitter is detected (as described below) by SJ frequency detector 120, or a different user-defined value (USR_DEF_H) when no low-frequency jitter is detected. It is understood that the FLSEL data stored in the LUT 124 is user programmable and might be changed during operation of the CDR 100 as needed. Because the jitter performance of the CDR is determined by the user-programmable values stored in the LUT 124 and selected by jitter frequency band, the user has considerable flexibility in defining the overall performance of the CDR 100. For example, using the quantized phase error samples from the quantizer 114 might yield the best jitter performance by the CDR 100 when low frequency jitter is present, but when no jitter or high frequency jitter is present then using the decimated phase error samples as input to the loop filter 122 might be preferred. Similarly, the best performance by the CDR might be obtained by using different filter loop gains Pg, Ig based on jitter frequency band as programmed into the LUT 124 by the user.

It is understood that while the embodiments shown here have a proportional path and an integral path, single path CDR embodiments can be implemented to take advantage of the phase error quantizer and jitter frequency detector/LUT techniques described here.

Figure 3:
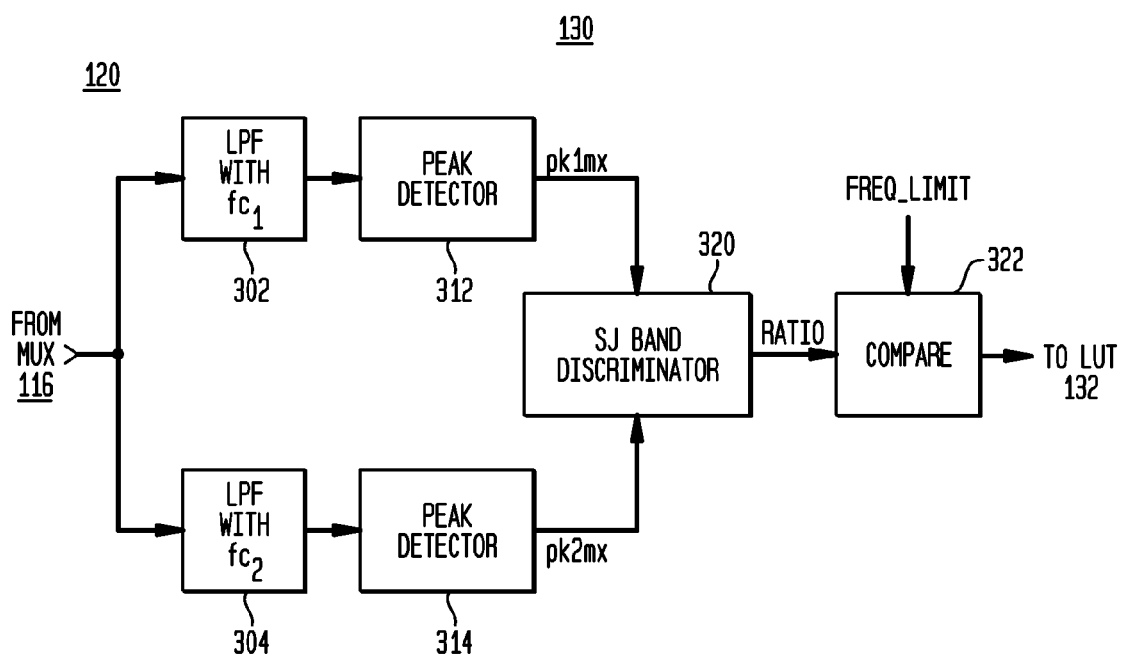
FIG. 3 is a simplified block diagram of the sinusoidal jitter band detector of FIG. 1.

FIG. 3 illustrates an exemplary sinusoidal jitter frequency band detector 120 according to one embodiment of the invention. Two low-pass filters (LPF) 302, 304 receive decimated phase error samples or proportional path quantized phase error samples (QPe) from multiplexer 116 (FIG. 1). Here, LPF 304 has a cutoff frequency $fc_2$ that is lower in frequency than a cutoff frequency $fc_1$ of LPF 302. In one embodiment, the LPF 302 and 304 are implemented in digital form as moving-average filters, with LPF 304 having more taps than LPF 302. In another embodiment described in FIG. 4, one filter is a moving average filter and the other an infinite-impulse response (IIR) filter. In still another embodiment, the frequency detector might be implemented based on the frequency detector disclosed in the above-mentioned U.S. patent application Ser. No. 14/053,069.

As is well known in the art, a moving-average filter has a transfer function of:

$$H(f)=(\sin(\pi f M))/(M \sin(\pi f));$$

where M is the number of unity-weighted taps. As evident from the above equation, the more the taps, the lower the cutoff frequency of the filter. In one specific embodiment, the LPF 302 has sixteen taps while LPF 304 has one hundred twenty eight (128) taps. In this embodiment, the ratio of the number of taps in one LPF to the other LPF should be based on the desired frequency band boundary between the low and high frequency bands.

The LPFs 302, 304 attenuate high frequency content so that the SJ frequency can be better estimated from the filter outputs. For lower SJ frequencies, the output of the LPF 304 contains more reliable information of the SJ frequency than the output of the LPF 304 because the LPF 304 passes higher frequency noise. For higher SJ frequencies, the output of LPF 304 contains more reliable information of SJ frequency than the output of LPF 302 because LPF 302 attenuates higher SJ frequency content.

Outputs from the LPFs couple to corresponding decimated digital peak detectors 312, 314. The peak detectors determine the peak amplitude of samples from the respective low-pass filters. The peak detectors are reset once the peak values are read after a digitally counted measurement interval.

To determine the frequency band of the jitter, the peak values from detectors 312 and 314 are processed by discriminator 320. In one embodiment, the discriminator 320 processes the peak values to produce as an output a discriminator value RATIO as follows:

$$\mathrm{RATIO} = \frac{PK1MX}{PK2MX} \frac{MALENGTH2}{MALENGTH1};$$

where PK1MX is the peak value from peak detector 312, PK2MX is the peak value from peak detector 314. MALENGTH1 is the number of taps in the moving average LPF 302, and MALENGTH2 is the number of taps in the moving average LPF 304.

Comparator 322 compares RATIO to a frequency limit value (FREQ_LIMIT) supplied by the user. In one embodiment, the comparator produces a "LOW" when detected jitter frequency is less than or equal to the frequency limit FREQ_LIMIT and a "HIGH" otherwise, e.g., no significant low frequency jitter is detected or dominant high frequency jitter (having a frequency greater than the user-supplied frequency limit) is detected:

BAND = LOW if RATIO ≤ FREQ_LIMIT; else

= HIGH.

To reduce the effect of noise on the comparator 322, hysteresis might be added thereto.

Figure 4:
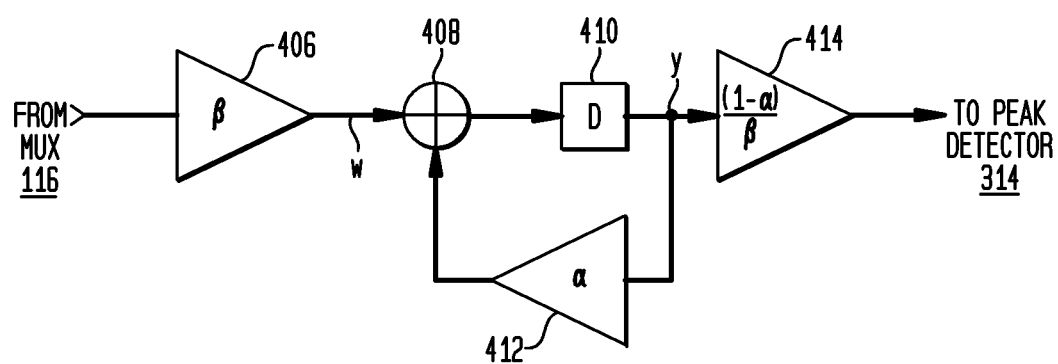
FIG. 4 is a simplified block diagram of an alternative embodiment of the sinusoidal jitter band detector of FIG. 1.

The alternative embodiment of the SJ frequency detector 130 shown in FIG. 4. Here, the moving-average LPF 304 of FIG. 3 is replaced with a single pole infinite-impulse response (IIR) filter 404. The filter 404 has an optional pre-scaling stage 406, summer 408, delay element 410, feedback stage 412, and an optional normalization stage 414. The core of the IIR filter 404 (i.e., ignoring the pre-scaling and normalizing stages) has a time domain behavior described by $y[n]=[w(n-1)+\alpha y(n-1)]$, where w is the input sample at time n to summer 408, y is the sample at time n−1 at the output of the delay element 410, and $\alpha$ is the feedback factor of feedback stage 412. In one example, the feedback factor is one hundred and twenty eight (128 or $2^7$), allowing it to be implemented with a simple bit shift.

Because the IIR filter 404 is likely to be implemented using finite precision arithmetic, and bit widths, there is a possibility that with small input samples the filter might not produce any output because the data values will be less than one bit value and have significant quantization noise. In order to compensate for using finite point arithmetic, a pre-scale factor of β, e.g., one hundred and twenty eight (128 or $2^7$), is used to scale up the phase error samples from multiplexer 116 before they are applied to the summer 408. A corresponding post-scale factor of (1−α), used to normalize the effect of the feedback scale factor α, is combined with a normalizing factor of 1/β factor in stage 414 to normalize the final IIR filtered results. Like the feedback factor provided by stage 412, scaling factors that are a power of two can be implemented with a simple bit shift, here seven bit positions for α and β equal to 128. In one embodiment, the post-scale factors 1/β and 1−α) can be absorbed into the final SJ band detection ratio calculation by discriminator 320. In this embodiment, the discriminator output RATIO is calculated as follows:

$$\text{RATIO} = \frac{PK1MX}{PK1MX} \frac{1-\alpha}{MALENGTH1} 1/\beta;$$

where PL1MX, PK2MX, MALENGTH1, α, and β are as defined above.

Quantizer 114 receives the decimated phase error samples from down-sampler 112 and compares the value of the phase error samples to two sets of threshold values from the LUT 124 to produce a quantized phase error sample value for each decimated error sample processed. One set of thresholds is for the proportional path of the loop filter 122, an upper threshold value THRPU and a lower threshold value THRPL. The other set of thresholds is for the integral path of the loop filter 122, an upper threshold value THRIU and a lower threshold value THRIL. The threshold values are provided by corresponding entries in the LUT 124 depending on the SJ band detector's jitter frequency band determination as discussed above. For example, if the SJ band detector determined that the jitter has a low frequency (the jitter frequency is less than or equal to the input FREQ_LIMIT), then LUT 124 will provide thresholds THRPULF, THRPLLF, THRIULF, and THRILLF for thresholds THRPU, THRPL, THRIU, and THRIL, respectively.

Figure 5:
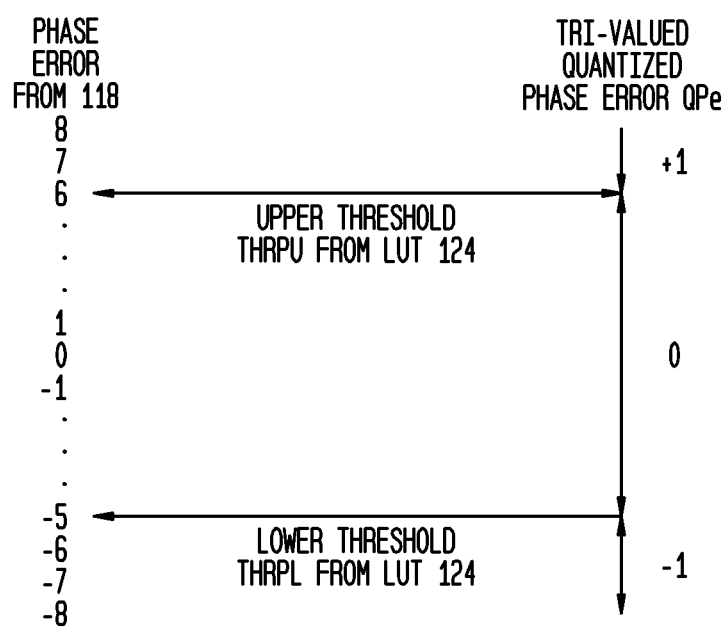
FIG. 5 illustrates an example of operation of the phase error quantizer in FIG. 1.

FIG. 5 illustrates operation of the quantizer 114 for one of the sets of quantizer thresholds from LUT 124, here for the proportional path using thresholds THRPU and THRPL. In this example, the decimated phase error values ranges from +8 to −8, which might be represented by five bits. Other ranges of phase error values might be used as needed. Here, the upper threshold THRPU is +6 and the lower threshold THRPL is −5. Thus, if the phase error is greater than or equal to +6, the quantizer produces a quantized phase error sample having a value of +1 at output QPe. If the phase error is less than or equal to minus five, then the quantizer produces a quantized phase error sample having a value of −1 at output QPe. Otherwise the quantizer outputs a quantized phase error sample having a value of zero (0). It is understood that the quantizer operates the same as described above for the integral path but using the thresholds THRIU and THRIL to produce the quantized phase error samples at output QIe. The outputs (QPe and QIe are in this example two bits wide.

Figure 6:
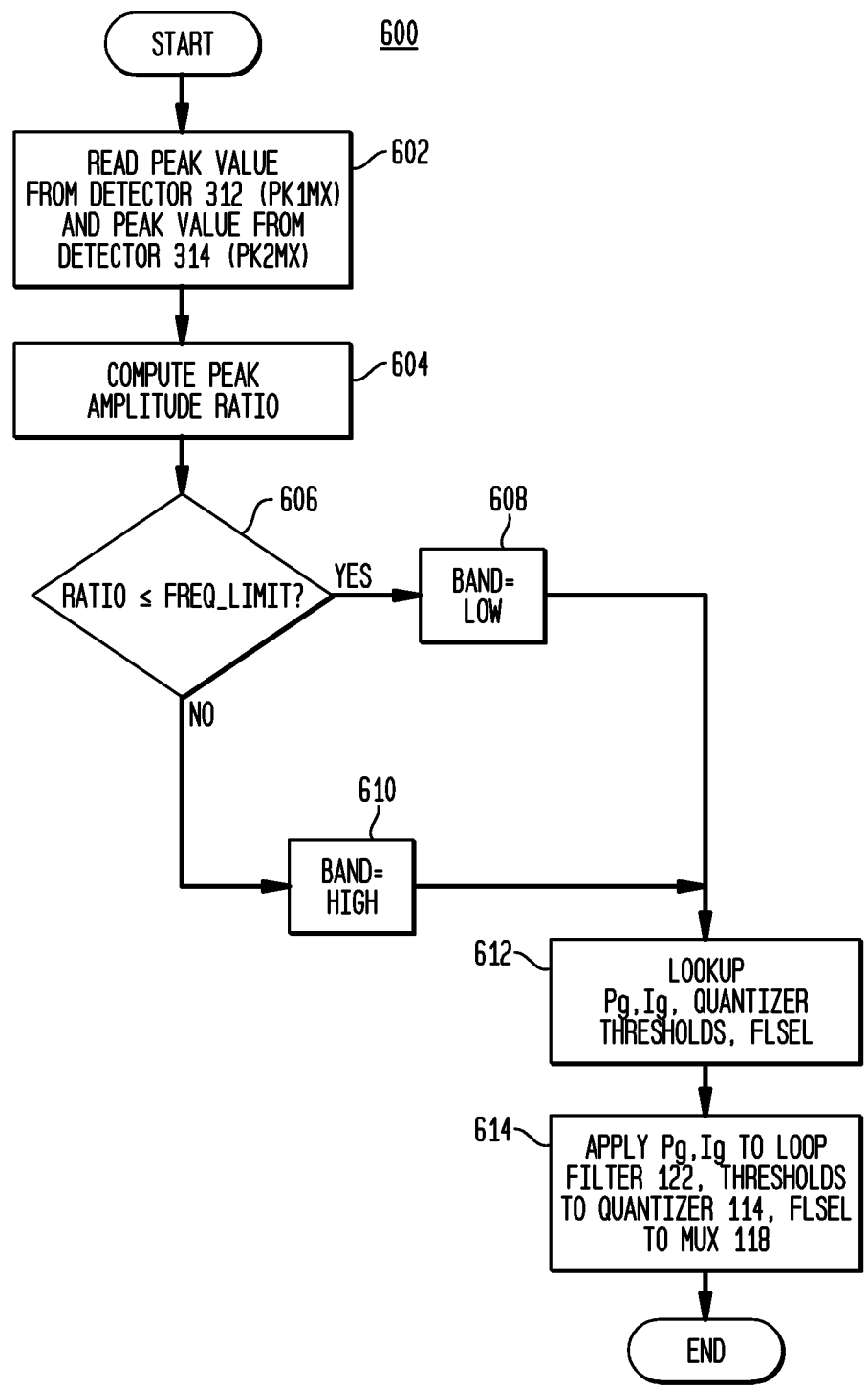
FIG. 6 is a simplified flow diagram illustrating an exemplary operation of the sinusoidal jitter band detector controlling the CDR of FIG. 1.

Operation of the CDR 100 is illustrated in FIG. 6. The process 600 begins with step 602 in which the discriminator 320 reads or receives the peak value measurements, designated here as PK1MX and PK2MX, from peak detectors 312 and 314, respectively. Then in step 606, the ratio of PK1MX to PK2 MX, as discussed above, is computed as RATIO. Next, RATIO is compared in step 608 to a user-supplied frequency limit value FREQ_LIMIT. If RATIO is less than or equal to the limit FREQ_LIMIT, then the SJ is determined to be in frequency band LOW and the variable BAND is set to LOW in step 610, and control passes to step 614. If RATIO is greater than FREQ_LIMIT, then in step 612 the variable BAND is set to HIGH, and control passes to step 614. In step 614, the appropriate values for loop filter gains (Pg, IG), quantizer thresholds (THRPU, THRPL, THRIU and THRIL), and control signal FLSEL are fetched from the LUT 124 such as the one shown in FIG. 2. Lastly, in step 516, the fetched values are applied to the loop filter 122, quantizer 114, and multiplexer 118, respectively.

It is understood that the process 600 can be modified to bin the SJ into three or more frequency bands and LUT 124 modified accordingly. Further, the discriminator 320 might be implemented as a state machine or digital processor to execute the process 600. Still further, the processor might be further adapted to perform all the functions of blocks 302-314 and, if desired, the functions of one or more of the blocks in FIG. 1. However, due to the high-speed requirements of some of the functional blocks in FIG. 1, such as the data detector 106 and BBPD 108, these functions might be implemented in hardware instead of software running on a processor. Further, decimator 110 down-sampler 110 are be added to the CDR 100 to reduce the speed requirements of some of the functional blocks in FIG. 1; in other embodiments they might not be required.

It is further understood that the exemplary clock and data recovery arrangement described above is useful in applications other than in SERDES receivers, e.g., communications transmitters and receivers generally.

While embodiments have been described with respect to circuit functions, the embodiments of the present invention are not so limited. Possible implementations, either as a stand-alone SERDES or as a SERDES embedded with other circuit functions, may be embodied in or part of a single integrated circuit, a multi-chip module, a single card, system-on-a-chip, or a multi-card circuit pack, etc. but are not limited thereto. As would be apparent to one skilled in the art, the various embodiments might also be implemented as part of a larger system. Such embodiments might be employed in conjunction with, for example, a digital signal processor, microcontroller, field-programmable gate array, application-specific integrated circuit, or general-purpose computer. It is understood that embodiments of the invention are not limited to the described embodiments, and that various other embodiments within the scope of the following claims will be apparent to those skilled in the art.

It is understood that various changes in the details, materials, and arrangements of the parts which have been described and illustrated in order to explain the nature of this invention may be made by those skilled in the art without departing from the scope of the invention as expressed in the following claims.

The invention claimed is:

1. A clock and data recovery device comprising:
   a phase detector coupled to an input node for producing phase error samples at an output;
   a quantizer, coupled to the output of the phase detector and responsive to a high threshold value and a low threshold value different from the high threshold value, for producing tri-valued quantized phase error samples at an output;
   a loop filter coupled to the output of the quantizer;
   a jitter frequency detector having an output and an input, the input coupled to the output of the quantizer;

a multiplexer, disposed between the loop filter and the output of the quantizer and having a control input coupled to the output of the jitter frequency detector, configured to selectively couple either the phase error samples or the quantized phase error samples to the loop filter in response to the jitter frequency detector.

2. The clock and data recovery device of claim 1 wherein the quantizer is configured to produce as the quantized phase error samples 1) a first one of the tri-valued phase error values when a phase error sample has a value that is greater than the high threshold value, 2) a second one of the tri-valued phase error values when a phase error sample has a value that is less than the low threshold value, and 3) a third one of the tri-valued phase error values when a phase error sample has a value that is between the high and low threshold values.

3. The dock and data recovery device of claim 2 wherein the loop filter has a proportional path and an integral path and the quantizer produces quantized phase error samples for the proportional path and different quantized phase error samples for the integral path using independent high and low threshold values for each path.

4. The clock and data recovery device of claim 1 further comprising:
  a look-up table disposed between the output of the jitter frequency detector and the multiplexer control input, the look-up table having stored therein jitter frequency dependent control information for configuring the multiplexer;
  wherein the multiplexer is configured to receive on its control input the jitter frequency control information from the look-up table.

5. The clock and data recovery device of claim 4 wherein the loop filter has a gain control input, the gain control input coupled to the look-up table having therein jitter frequency dependent gain control information for setting the gain of the loop filter.

6. The clock and data recovery device of claim 5 further comprising:
  an additional multiplexer disposed between the output of the quantizer and the input of the jitter frequency detector, the additional multiplexer configured to selectively couple either the phase error samples or the quantized phase error samples to the input of the jitter frequency detector.

7. The clock and data recovery device of claim 4 wherein the look-up table has stored therein jitter frequency dependent high and low threshold values and the quantizer is configured to receive the high and low threshold values from the look-up table.

8. The clock and data recovery device of claim 1 wherein the phase detector comprises:
  bang-bang phase detector having an input and an output, the input coupled to the input node;
  a decimation filter having an output and an input, the input coupled to the output of the bang-bang phase detector;
  a down-sampler having an input and providing the phase error samples to an output, the input coupled to the output of the decimation filter and the output coupled to the input of the quantizer.

9. The clock and data recovery device of claim 8 further comprising:
  a reference clock source;
  a phase shifter configured to phase shift the reference clock in response to a phase code on the output of the loop filter;

a sampler, coupled between the input node and the input of the bang-bang phase detector, responsive to the phase-shifted reference clock; and
  a data detector disposed between the sampler and the bang-bang phase detector.

10. An integrated circuit comprising; the apparatus of claim 1.

11. A clock and data recovery device comprising:
  a phase detector coupled to an input node for producing a phase error samples at an output;
  a quantizer, having an input coupled to the output of the phase detector and responsive to a high threshold value and a low threshold value, configured to produce at an output as quantized phase error samples 1) a first one of tri-valued phase error values when a phase error sample has a value that is greater than the high threshold value, 2) a second one of the tri-valued phase error values when a phase error sample has a value that is less than the low threshold value, and 3) a third one of the tri-valued phase error values when a phase error sample has a value that is between the high and low threshold values;
  a first multiplexer having an output, a first input coupled to the output of the quantizer, and a second input coupled to the output of the phase detector, the multiplexer configured to selectively couple either the phase error samples or the quantized phase error samples to the output of the first multiplexer;
  a loop filter having a gain control input and an input coupled to the output of the first multiplexer;
  a jitter frequency detector having an output and an input, the input coupled to the output of the quantizer;
  a look-up table having stored therein jitter frequency dependent control information for configuring the first multiplexer, loop gain data, and first and second threshold data values;
  wherein the first multiplexer is configured to receive on its control input the jitter frequency control data from the look-up table, the loop filter is configured to receive on its gain control input the loop gain data from the look-up table, and the quantizer is configured to receive the first and second threshold data values from the look-up table.

12. The clock and data recovery device of claim 11 further comprising:
  a second multiplexer having an output, a first input coupled to the output of the quantizer, and a second input coupled to the output of the phase detector, the multiplexer configured to selectively couple either the phase error samples or the quantized phase error samples to the output of the second multiplexer.

13. The clock and data recovery device of claim 11 wherein the phase detector comprises:
  bang-bang phase detector having an input and an output, the input coupled to the input node;
  a decimation filter having an output and an input, the input coupled to the output of the bang-bang phase detector;
  a down-sampler providing the phase error samples at an output and having an input, the input coupled to the output of the decimation filter and the output coupled to the input of the quantizer.

14. The clock and data recovery device of claim 13 further comprising:
  a reference clock source;
  a phase shifter configured to phase shift the reference clock in response to a phase code on the output of the loop filter;

a sampler, coupled between the input node and the input of the bang-bang phase detector, responsive to the phase-shifted reference clock; and a data detector disposed between the sampler and the bang-bang phase detector.

15. An integrated circuit comprising the apparatus of claim 14.

16. The clock and data recovery device of claim 11 wherein the loop filter has a proportional path with a proportional path gain, and an integral path with an integral path gain, the quantizer produces quantized phase error samples for the linear path and different quantized phase error samples for the integral path using independent high and low threshold values for each path.

17. The clock and data recovery device of claim 16 wherein the look-up table, in response to the jitter frequency detector, provides the proportional path gain and the integral path gain to the loop filter, and provides the high and low threshold values to the quantizer for both the proportional path and the integral paths.

18. A method of recovering a clock from an incoming data signal comprising the steps of:

generating, with a phase detector, a phase error samples indicative of a phase difference between a phase-adjusted reference clock and the incoming data signal;

comparing the phase error samples to a high threshold value and a low threshold value to produce a quantized phase error samples;

selecting, with a multiplexer, one of the phase error samples and the quantized phase error samples;

filtering, with a loop filter having a gain, the selected one of the phase error samples and the quantized phase error samples from the multiplexer;

determining, with a jitter frequency detector responsive to one of the phase error samples and the quantized phase error samples, a frequency of jitter present in the incoming data signal;

addressing a look-up table using results from the determining step;

obtaining, from the addressed look-up table, high and low threshold values for the quantizer and a control signal; and applying the high and low threshold values from the addressed look-up table to the quantizer; and configuring the multiplexer in response to the control signal.

19. The method of claim 18 wherein further comprising the steps of:

obtaining, from the addressed look-up table, a loop filter gain; and applying the loop filter gain to the loop filter to set the gain of the loop filter.

20. An apparatus comprising:

an input node;

a first low-pass filter, coupling to the input node, having a first cutoff frequency and an output;

a second low-pass filter, coupling to the input node, having a second cutoff frequency less than the first cutoff frequency and an output;

a first digital peak detector having an output and an input, the input coupled to the output of the first low-pass filter;

a second digital peak detector having an output and an input, the input coupled to the output of the second low-pass filter; and a frequency band discriminator configured to:

compute an amplitude ratio between a digital peak value from the first peak detector and a digital peak value from the second peak detector; and compare the amplitude ratio to at least one frequency limit value, the limit value related to a first frequency band;

wherein an input signal applied to the input node has a frequency in the first frequency band if the amplitude ratio is less than the frequency limit value.

21. A method of determining a frequency of an input signal applied to an input node comprising the steps of:

filtering the input signal with a first low-pass filter having a cutoff frequency to produce a first filtered signal;

filtering the input signal with a second low-pass filter having a cutoff frequency less than the cutoff frequency of the first filter to produce a second filtered signal;

detecting a first digital peak value from the first filtered signal;

detecting a second digital peak value from the second filtered signal;

computing an amplitude ratio between the first digital peak value and the second digital peak value; and comparing the amplitude ratio to at least one frequency limit value, the limit value related to a first frequency band;

determining the frequency band of the input signal based on results from the comparing step.

* * * * *